United States Patent [19]
Sun

[11] Patent Number: 5,614,862
[45] Date of Patent: Mar. 25, 1997

[54] DIGITAL DEMODULATOR FOR A FREQUENCY MODULATED SIGNAL AND AN AMPLITUDE MODULATED SIGNAL

[75] Inventor: Weimin Sun, Nara, Japan

[73] Assignee: Icom Incorporated, Osaka, Japan

[21] Appl. No.: 622,655

[22] Filed: Mar. 26, 1996

[30]     Foreign Application Priority Data

Oct. 27, 1995  [JP]  Japan .................................... 7-281062

[51] Int. Cl.⁶ .............................. H03D 1/00; H03D 3/00; H03D 5/00
[52] U.S. Cl. .......................... 329/341; 329/317; 329/343; 329/347; 455/337
[58] Field of Search ..................................... 329/315, 317, 329/341–343, 347, 356, 357, 363; 455/201–205, 214, 337

[56]              References Cited

U.S. PATENT DOCUMENTS

| | | | |
|---|---|---|---|
| 4,528,511 | 7/1985 | Smith | 433/337 X |
| 4,755,761 | 7/1988 | Ray, Jr. | 329/323 |
| 4,779,054 | 10/1988 | Monteleone et al. | 329/343 X |

FOREIGN PATENT DOCUMENTS

| | | |
|---|---|---|
| 63-288504 | 11/1988 | Japan . |
| 6-291553 | 10/1994 | Japan . |

*Primary Examiner*—David Mis
*Attorney, Agent, or Firm*—Frishauf, Holtz, Goodman, Langer & Chick

[57]           ABSTRACT

A DMUX 11 outputs data in a digital FM signal in a circulation to produce signals S1 to S4. An MUX 14 alternately outputs inverted signals of the signals S1 and S3, obtaining a signal $Si_{(k)}$. An MUX 15 alternately outputs inverted signals of the signals S2 and S4, obtaining a signal $Sq_{(k)}$. An interpolation circuit 17 inserts data having a value of zero between individual data in the output signal of the MUX 14, and cuts off the high-frequency component of the resultant signal, obtaining a signal $Si_{(i)}$. A second interpolation circuit 19 inserts data having a value of zero between individual data in the output signal of the MUX 15, and cuts off the high-frequency component of the resultant signal, obtaining a signal $Sq_{(i)}$. An arithmetic operation circuit 2 computes $SI_{(i-1)} \cdot SQ_{(i)} - SI_{(i)} \cdot Sq_{(i-1)}$, and integrates it to obtain a digital demodulated signal.

12 Claims, 8 Drawing Sheets

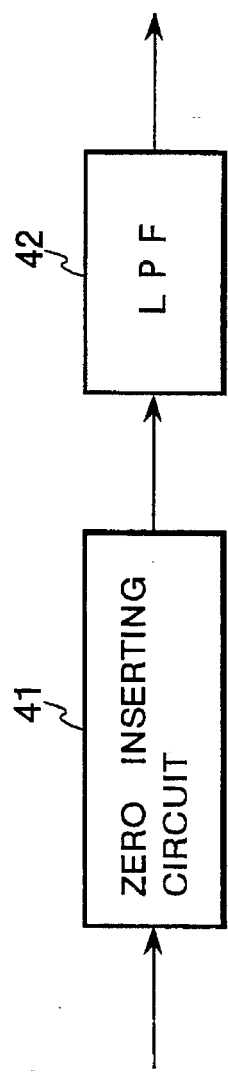
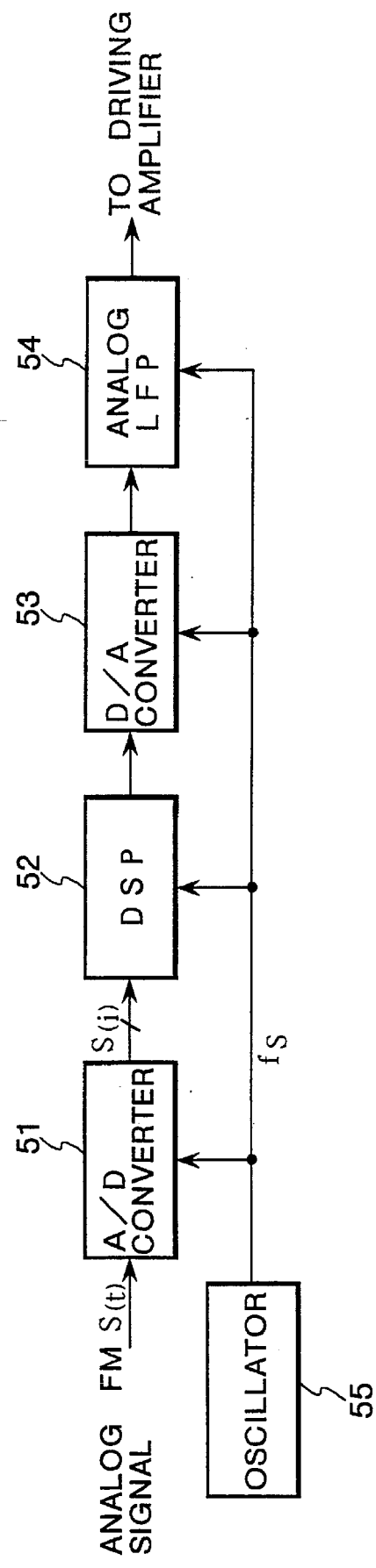

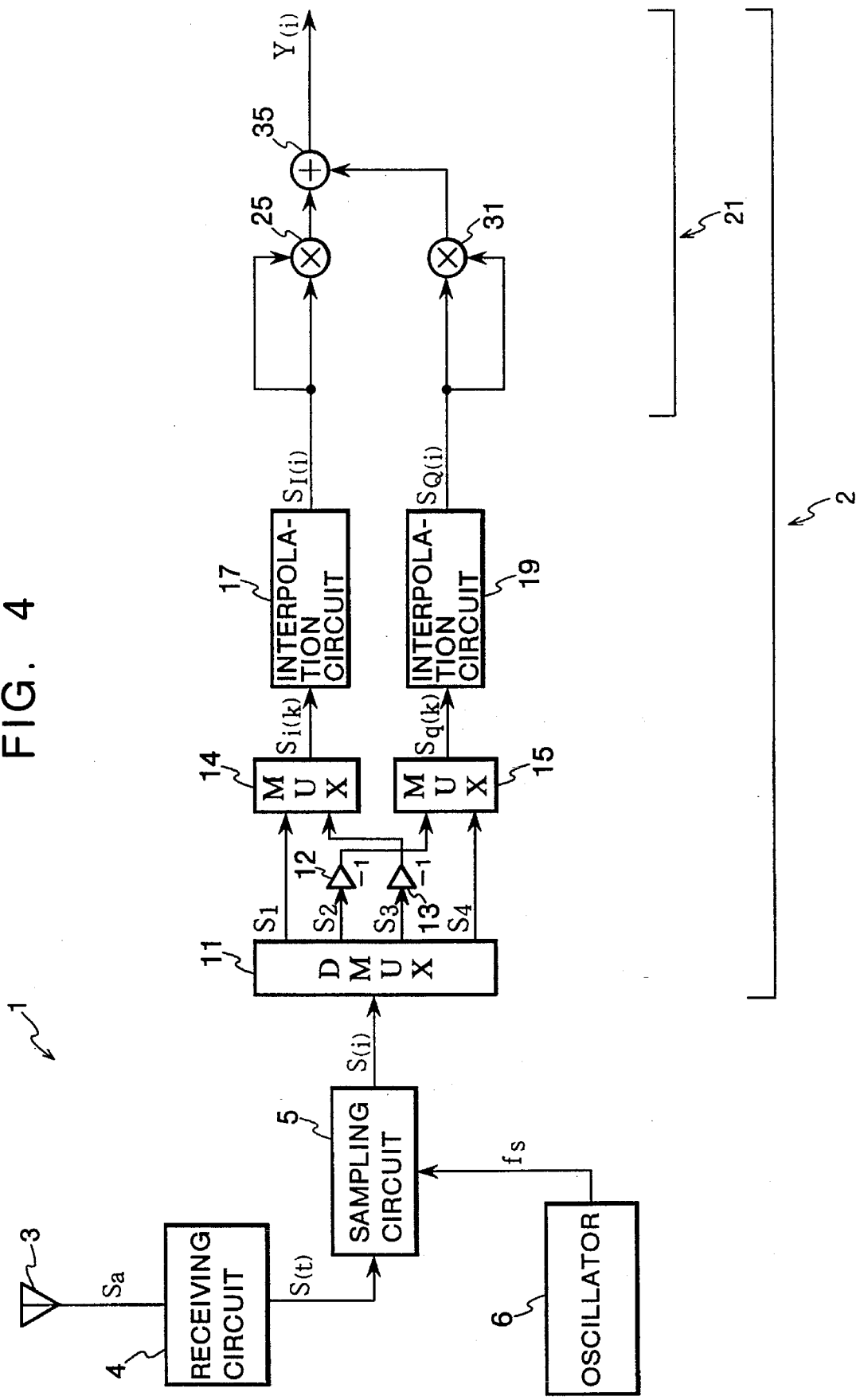

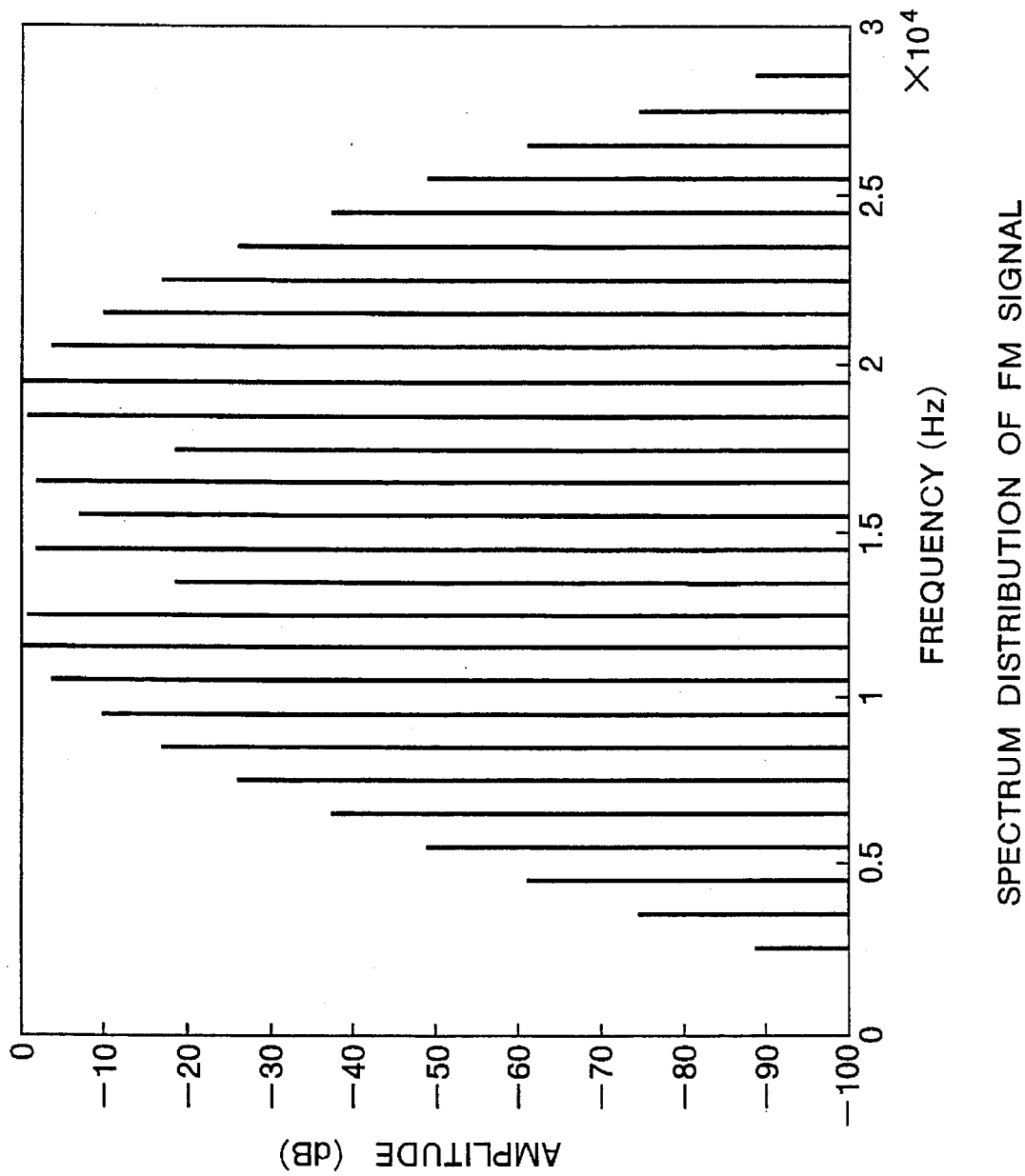

DIGITAL DEMODULATOR FOR A FREQUENCY MODULATED SIGNAL AND AN AMPLITUDE MODULATED SIGNAL

BACKGROUND OF THE INVENTION

1. Field of the Invention

The present invention relates to a digital demodulator with a simple structure, which is capable of obtaining high quality demodulated signals.

2. Description of the Related Art

Digital FM demodulators are widely used in the fields of radio communications, particularly, in the field of mobile radio communications. As digital FM demodulators have more complex structures than analog FM demodulators, it is difficult to realize each digital FM demodulator by an integrated circuit (hereinafter called "IC"), a digital signal processor (hereinafter called "DSP") or the like. This is because the function of an ordinary digital FM demodulator needs complicated processing which involves trigonometric functions or is executed by a 90° phase shifter, and thus requires large-capacity memory and vast amount of computations.

Digital FM demodulators which use a 90° phase shifter are disclosed in, for example, U.S. Pat. No. 4,755,761 and Unexamined Japanese Patent Publication Nos. Sho 63-288504 and Hei 6-291553.

This type of digital FM demodulator suffers a difficulty in reproducing carriers and a difficulty in being designed into an IC because of the use of the 90° phase shifter.

SUMMARY OF THE INVENTION

Accordingly, it is an objective of the present invention to provide a digital demodulator with a simple structure.

It is another objective of this invention to provide a digital demodulator which can be accomplished by an IC, a DSP or the like.

To achieve the foregoing and other objects, a digital demodulator according to the first aspect of this invention comprises:

time sequential signal generating means for receiving a digital signal and producing a first signal, which includes a sequence of odd-numbered data in the received digital signal and whose sign is inverted data by data, and a second signal, which includes a sequence of even-numbered data in the received digital signal and whose sign is inverted data by data;

first interpolation means for inserting data having a value of zero between individual pieces of data of the first signal output from the time sequential signal generating means;

second interpolation means for inserting a signal having a value of zero between individual pieces of data of the second signal output from the time sequential signal generating means; and arithmetic operation means for producing a digital demodulated signal from output signals of the first interpolation means and the second interpolation means.

A digital demodulator according to the second aspect of this invention comprises:

first means for producing digital signals $Si_{(k)}$ and $Sq_{(k)}$ respectively expressed by equations (2) and (3) from a digital signal $S_{(i)}$ expressed by an equation (1);

second means for producing digital signals $Si'_{(i)}$ and $Sq'_{(i)}$ respectively expressed by equations (4) and (5) from the digital signals $Si_{(k)}$ and $Sq_{(k)}$;

third means for producing digital signals $SI_{(i)}$ and $SQ_{(i)}$ respectively expressed by equations (6) and (7) from the digital signals $Si'_{(i)}$ and $Sq'_{(i)}$; and fourth means for producing a digital demodulated signal $y_{(i)}$ expressed by an equation (8) from the digital signals $SI_{(i)}$ and $SQ_{(i)}$;

$$S_{(i)} = A \cdot \sin(2\pi fc \cdot i/fs + \delta \cdot \sin(2\pi f \cdot i/fs)) \quad (1)$$

where A is an amplitude, $\delta = fd/f$, fd is a maximum frequency deviation, f is a frequency of a modulated signal, fs is a sampling frequency, $i=1, 2, 3, \ldots$, and fc is a carrier frequency and $fc=fs/4$, $$Si_{(k)} = A_{(2 \cdot k-1)} \cdot \cos(\delta \cdot \sin(2\pi f \cdot (2 \cdot k-1)/fs)) \quad (k=1, 2, 3, \ldots) \quad (2)$$

$$Sq_{(k)} = A_{(2 \cdot k)} \cdot \sin(\delta \cdot \sin(4\pi f \cdot k/fs)) \quad (3)$$

$$Si'_{(i)} = \{A_{(1)} \cdot \cos(\delta \cdot \sin(2\pi f/fs)), 0, A_{(3)} \cdot \cos(\delta \cdot \sin(6\pi f/fs)), 0, \ldots\} \quad (4)$$

$$Sq'_{(i)} = \{0, A_{(2)} \cdot \sin(\delta \cdot \sin(4\pi f/fs)), 0, A_{(4)} \cdot \sin(\delta \cdot \sin(8\pi f/fs)), \ldots\} \quad (5)$$

$$SI_{(i)} = A_{(i)} \cdot \cos(\delta \cdot \sin(2\pi f \cdot i/fs)) \quad (6)$$

$$SQ_{(i)} = A_{(i)} \cdot \sin(\delta \cdot \sin(2\pi f \cdot i/fs)) \quad (7)$$

$$y_{(i)} = B \cdot \{\sin(2\pi f \cdot i/fs) - \sin(2\pi f \cdot (i-1)/fs)\} \quad (8)$$

where B is approximately constant.

A digital demodulator according to the third aspect of this invention comprises:

first means for producing digital signals $Si_{(k)}$ and $Sq_{(k)}$ respectively expressed by equations (10) and (11) from a digital signal $S_{(i)}$ expressed by an equation (9);

second means for producing digital signals $Si'_{(k)}$ and $Sq'_{(k)}$ respectively expressed by equations (12) and (13) from the digital signals $Si_{(k)}$ and $Sq_{(k)}$;

third means for producing digital signals $SI_{(i)}$ and $SQ_{(i)}$ respectively expressed by equations (14) and (15) from the digital signals $Si'_{(k)}$ and $Sq'_{(k)}$; and fourth means for producing a digital demodulated signal $y_{(i)}$ expressed by an equation (16) from the digital signals $SI_{(i)}$ and $SQ_{(i)}$;

$$S_{(i)} = (A+1) \cdot \cos(2\pi fc \cdot i/fs) \quad (9)$$

where A is an amplitude signal, fc is a carrier frequency, and fs is a sampling frequency, $$Si_{(k)} = (A_{(2 \cdot k-1)}+1) \cdot \sin(2 \cdot (2 \cdot k-1) \cdot \pi \cdot \Delta f + \phi) \quad (k=1, 2, 3, \ldots) \quad (10)$$

$$Sq_{(k)} = (A_{(2 \cdot k)}+1) \cdot \cos(4 \cdot k \cdot \pi \cdot \Delta f + \phi) \quad (11)$$

$$\{Si'_{(k)}\} = \{(A_{(1)}+1) \cdot \sin(2\pi \Delta f + \phi), 0, (A_{(3)}+1) \cdot \sin(6\pi \Delta f + \phi), 0, \ldots\} \quad (12)$$

$$\{Sq'_{(k)}\} = \{0, (A_{(2)}+1) \cdot \cos(4\pi \Delta f + \phi), 0, (A_{(4)}+1) \cdot \sin(8\pi \Delta f + \phi), 0, \ldots\} \quad (13)$$

$$SI_{(i)} = (A_{(i)}+1) \cdot \sin(2\pi \Delta f + \phi) \quad (14)$$

$$SQ_{(i)} = (A_{(i)}+1) \cdot \cos(2\pi \Delta f + \phi) \quad (15)$$

$$y_{(i)} = B \cdot (A_{(i)}+1)^2 \quad (16)$$

where B is approximately constant.

BRIEF DESCRIPTION OF THE DRAWINGS

FIG. 2 is a block diagram showing the structure of an interpolation circuit shown in FIG. 1;

FIG. 4 is a block diagram showing the structure of an AM receiver according to the third embodiment of the present invention;

FIG. 5 is a block diagram showing the structure of a digital FM demodulator embodying this invention, which is constituted by using a DSP;

FIG. 6 is a spectrum distribution diagram for an FM signal used in evaluating the digital demodulator having the structure shown in FIG. 5;

DETAILED DESCRIPTION OF THE PREFERRED EMBODIMENTS

Digital FM demodulators according to preferred embodiments of the present invention will now be described with reference to the accompanying drawings.

First Embodiment

Figure 1:
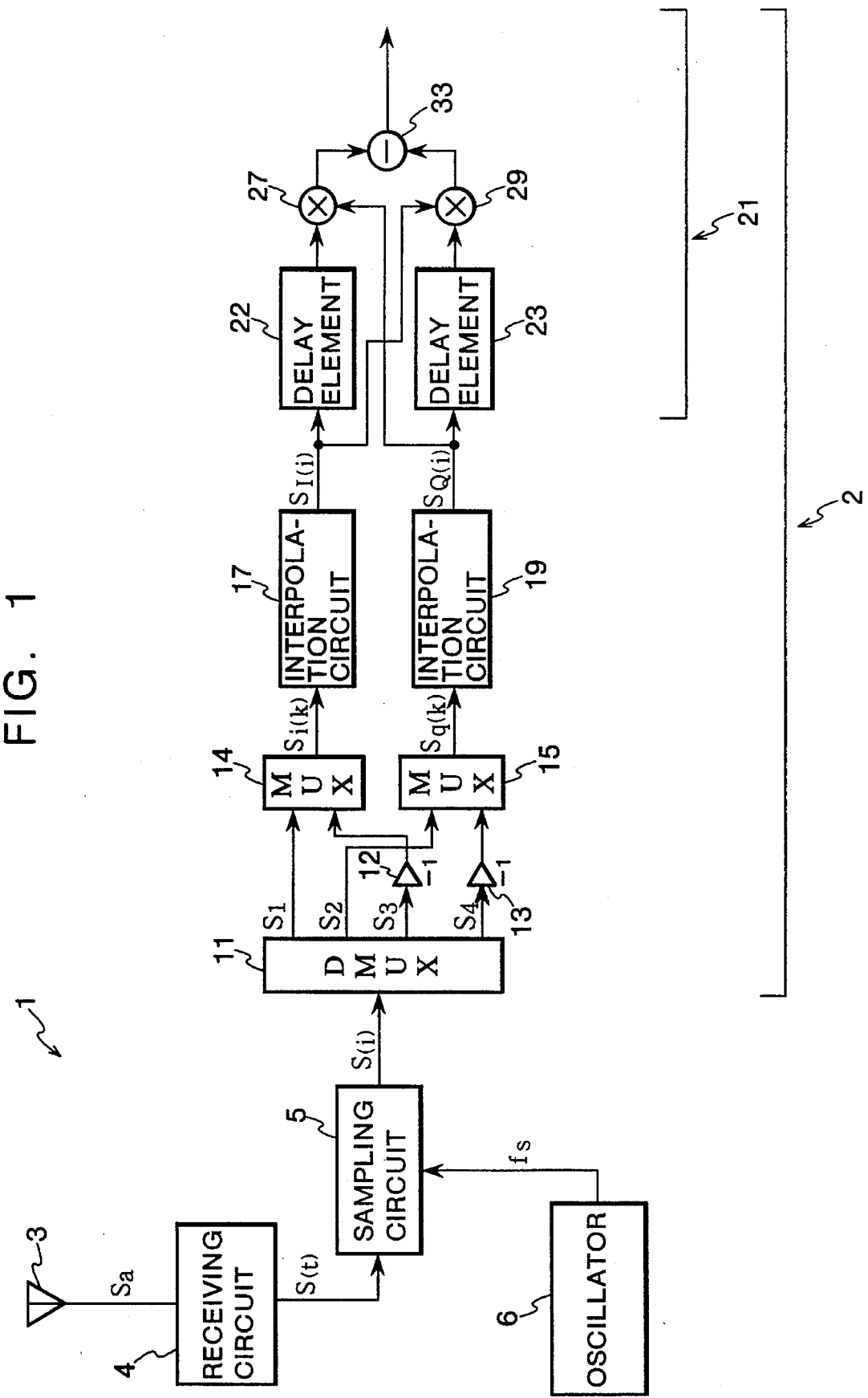
FIG. 1 is a block diagram showing the structure of an FM receiver according to the first embodiment of the present invention.

FIG. 1 is a block diagram showing the structure of an FM receiver 1 according to the first embodiment of the present invention.

As illustrated, this FM receiver 1 comprises an antenna 3, a receiving circuit 4, a sampling circuit 5, an oscillator 6, and a digital FM demodulator 2.

The digital FM demodulator 2 includes a demultiplexer (DMUX) 11, inverters 12 and 13, multiplexers (MUX) 14 and 15, interpolation circuits 17 and 19, and an arithmetic operation circuit 21. The arithmetic operation circuit 21 includes delay elements 22 and 23, multipliers 27 and 29 and a subtracter 33.

The antenna 3 supplies an FM signal Sa to the receiving circuit 4. The receiving circuit 4 performs amplification, frequency conversion, tuning and the like on the received FM signal Sa to produce an intermediate frequency signal $S_{(t)}$, and supplies the intermediate frequency signal $S_{(t)}$ to the sampling circuit 5. The sampling circuit 5 samples the intermediate frequency signal $S_{(t)}$ to convert it to a digital signal $S_{(i)}$ in accordance with a sampling signal supplied from the oscillator 6, and supplies the digital signal $S_{(i)}$ to the digital FM demodulator 2. The oscillator 6 supplies a sampling signal of a sufficiently higher frequency than that of a demodulated signal to the sampling circuit 5 and the digital FM demodulator 2.

The DMUX 11 sequentially outputs the input signal (data) supplied from the sampling circuit 5 to four output terminals as signals S1 to S4. The inverters 12 and 13 perform phase conversion of 180 degrees (sign inversion) on the signals S3 and S4 supplied from the third and fourth output terminals, respectively. The MUX 14 alternately selects and outputs the signals supplied from the first output terminal of the DMUX 11 and from the inverter 12. The MUX 15 alternately selects and outputs the signals supplied from the second output terminal of the DMUX 11 and from the inverter 13.

Each of the interpolation circuits 17 and 19 comprises a zero inserting circuit 41 and an LPF (Low-Pass Filter) 42, as shown in FIG. 2. The zero inserting circuit 41 inserts a signal (data) of a value of zero (0) between signals (data) which are sequentially output from the MUX 14 or 15. The LPF 42 removes the high-frequency component from the signal supplied from the zero inserting circuit 41.

The delay elements 22 and 23 of the arithmetic operation circuit 21 respectively delay the output signals the interpolation circuits 17 and 19 by one sampling period.

The multiplier 27 multiplies the output signal of the delay element 22 by the output signal of the interpolation circuit 19.

The multiplier 29 multiplies the output signal of the delay element 23 by the output signal of the interpolation circuit 17.

The subtracter 33 subtracts the output signal of the multiplier 27 from the output signal of the multiplier 29.

The operation of the FM receiver 1 shown in FIG. 1 will now be described.

The digital FM demodulator 2 receives the intermediate frequency signal $S_{(t)}$, which has been sampled by the sampling circuit 5 and is expressed by an equation (17). For easier understanding, the amplitude A of the intermediate frequency signal $S_{(t)}$ is assumed to be a constant value Im.

$$S_{(t)} = Im \cdot \sin(2 \cdot \pi \cdot fc \cdot t + \delta \cdot \sin(2 \cdot \pi \cdot f \cdot t)) \tag{17}$$

where fc is the carrier frequency, $\delta = fd/f$, fd is the maximum frequency deviation, f is the frequency of a modulated signal, fs is the sampling frequency, and i=1, 2, 3, ...

When the carrier frequency fc is set to ¼ of the sampling frequency fs (fc=fs/4), the equation (17) can be rewritten as an equation (18).

That is, a digital FM signal $S_{(i)}$ expressed by the equation (18) is supplied to the digital FM demodulator 2.

$$S_{(i)} = Im \cdot \sin((\pi \cdot i)/2 + \delta \cdot \sin(2 \cdot \pi f \cdot i/fs)) \tag{18}$$

The signal $S_{(i)}$ given by the equation (18) can be rewritten as expressed by an equation (19).

$$\{S_{(i)}\} = \{Im \cdot \cos(\delta \cdot \sin(2 \cdot \pi \cdot f/fs)), \tag{19}$$

$$-Im \cdot \sin(\delta \cdot \sin(4 \cdot \pi \cdot f/fs)), -Im \cdot \cos(\delta \cdot \sin(6 \cdot \pi \cdot f/fs)),$$

$$Im \cdot \sin(\delta \cdot \sin(8 \cdot \pi \cdot f/fs)), \ldots \}$$

The DMUX 11 sequentially outputs the individual pieces of data of the digital signal $Si_{(i)}$ expressed by the equation (19) to the four output terminals in circulation. Therefore, the digital signals $S1_{(k)}$ to $S4_{(k)}$ to be output from the first to fourth output terminals are expressed by the following equations (20) to (23).

$$S1_{(k)} = Im \cdot \cos(\delta \cdot \sin(2 \cdot \pi \cdot f \cdot (4 \cdot k - 3)/fs)) \tag{20}$$

$$S2_{(k)} = -Im \cdot \sin(\delta \cdot \sin(2 \cdot \pi \cdot f \cdot (4 \cdot k - 2)/fs)) \tag{21}$$

$$S3_{(k)} = -Im \cdot \cos(\delta \cdot \sin(2 \cdot \pi \cdot f \cdot (4 \cdot k - 1)/fs)) \tag{22}$$

$$S4_{(k)} = Im \cdot \sin(\delta \cdot \sin(8 \cdot \pi \cdot f \cdot k/fs)) \tag{23}$$

The inverter 12 performs phase conversion of 180 degrees (sign inversion) on the signal $S3_{(k)}$ to obtain $-S3_{(k)}$, which is in turn supplied to the MUX 14. The MUX 14 receives the signal $S1_{(k)}$ and $-S3_{(k)}$ and alternately outputs the input signals. The output signal $Si_{(k)}$ of the MUX 14 or the digital signal output from the MUX 14 is given by an equation (24). This digital signal $Si_{(k)}$ consists of a sequence of odd-numbered data in the digital FM signal $S_{(i)}$, and its sign inverts data by data.

The inverter 13 performs phase conversion of 180 degrees (sign inversion) on the signal $S4_{(k)}$ to obtain $-S4_{(k)}$, which is in turn supplied to the MUX 15. The MUX 15 receives the signal $S2_{(k)}$ and $-S4_{(k)}$ and alternately outputs the input signals. The digital signal $Sq_{(k)}$ output from the MUX 15 is given by an equation (25). This output signal $Sq_{(k)}$ consists of a sequence of even-numbered data in the digital FM signal $S_{(i)}$, and its sign inverts data by data.

$$Si_{(k)} = \{S_{(1)}, -S_{(3)}, S_{(5)}, -S_{(7)}, \ldots\} \quad (24)$$
$$= Im \cdot \cos(\delta \cdot \sin(2 \cdot \pi \cdot f \cdot (2 \cdot k - 1)/fs))$$

$$Sq_{(k)} = \{S_{(2)}, -S_{(4)}, S_{(6)}, -S_{(8)}, \ldots\} \quad (25)$$
$$= Im \cdot \sin(\delta \cdot \sin(4 \cdot \pi \cdot f \cdot k/fs))$$

where $k=1, 2, 3, \ldots$

The signals $Si_{(k)}$ and $Sq_{(k)}$ have the relationship given by an equation (26).

$$Si_{(k+1)} = \hat{}Sq_{(k)} \quad (26)$$

where $\hat{}Sq_{(k)}$ indicates that it has a phase difference of 90 degrees to $Sq_{(k)}$.

To convert the sampling frequency of $Si_{(k)}$ and $Sq_{(k)}$ to fs, the zero inserting circuit 41 of the interpolation circuit 17 receives the signal $Si_{(k)}$, inserts data of a value of zero (0) between individual data of the signal $Si_{(k)}$ and outputs a signal $Si'_{(i)}$ given by an equation (27)

The zero inserting circuit 41 of the interpolation circuit 19 receives the signal $Sq_{(k)}$, inserts data of a value of zero (0) between individual data of the signal $Sq_{(k)}$, and outputs a signal $Sq'_{(i)}$ given by an equation (28).

$$Si'_{(i)} = \{S_{(1)}, 0, -S_{(3)}, 0, S_{(5)}, 0, -S_{(7)}, \ldots\} \quad (27)$$

$$Sq'_{(i)} = \{0, S_{(2)}, 0, -S_{(4)}, 0, S_{(6)}, 0, -S_{(8)}, \ldots\} \quad (28)$$

The LPF 42 of the interpolation circuit 17 removes the high-frequency component of the signal $Si'_{(i)}$ and outputs a digital signal $SI_{(i)}$ given by an equation (29). The LPF 42 of the interpolation circuit 19 removes the high-frequency component of the signal $Sq'_{(i)}$ and outputs a digital signal $SQ_{(i)}$ given by an equation (30).

$$SI_{(i)} = Im \cdot \cos(\delta \cdot \sin(2 \cdot \pi \cdot f \cdot i/fs)) \quad (29)$$

$$SQ_{(i)} = Im \cdot \sin(\delta \cdot \sin(2 \cdot \pi \cdot f \cdot i/fs)) \quad (30)$$

The signals $SI_{(i)}$ and $SQ_{(i)}$ are orthogonal to each other as indicated by an equation (31).

$$SI_{(i)} = \hat{}SQ_{(i)} \quad (31)$$

The delay element 22 delays the signal $SI_{(i)}$ by one sampling period and outputs a signal $SI_{(i-1)}$. The multiplier 27 multiplies the signal $SI_{(i-1)}$ by the output signal $SQ_{(i)}$ of the interpolation circuit 19. The delay element 23 delays the signal $SQ_{(i)}$ by one sampling period and outputs a signal $SQ_{(i-1)}$. The multiplier 29 multiplies the signal $SQ_{(i-1)}$ by the output signal $SI_{(i)}$ of the interpolation circuit 17. The subtracter 33 subtracts the output signal of the multiplier 27 from the output signal of the multiplier 29, and outputs a digital signal $Y_{(i)}$ expressed by an equation (32).

$$\begin{aligned}
Y_{(i)} &= SQ_{(i)} \cdot SI_{(i-1)} - SQ_{(i-1)} \cdot SI_{(i)} \quad (32) \\
&= Im^2 \{\sin(\delta \cdot \sin(2 \cdot \pi \cdot f \cdot i/fs)) \cdot \\
&\quad \cos(\delta \cdot \sin(2 \cdot \pi \cdot f \cdot (i-1)/fs)) - \\
&\quad \cos(\delta \cdot \sin(2 \cdot \pi \cdot f \cdot i/fs)) \cdot \\
&\quad \sin(\delta \cdot \sin(2 \cdot \pi \cdot f \cdot (i-1)/fs))\} \\
&= Im^2 \{\sin(\delta \cdot \sin(2 \cdot \pi \cdot f \cdot i/fs) - \\
&\quad \sin(2 \cdot \pi \cdot f \cdot (i-1)/fs))\}
\end{aligned}$$

The sampling frequency fs is set sufficiently higher than the frequency f of a demodulated signal as mentioned above, so that the equation (32) can be rewritten as the following equation (33).

$$Y_{(i)} = Im^2 \cdot \delta(\sin(2 \cdot \pi \cdot f \cdot i/fs) - \sin(2 \cdot \pi \cdot f \cdot (i-1)/fs)) \quad (33)$$

The demodulated signal may be obtained by integrating the signal $Y_{(i)}$ given by the equation (33).

The digital FM demodulator 2 in FIG. 2 can demodulate an FM input signal with a constant amplitude. Further, since there are only two LPFs used, one in each of the interpolation circuits 17 and 19, this digital FM demodulator can be realized by a simple and small-scale circuit structure. The digital FM demodulator 2 can easily be constituted of an integrated circuit such as IC or DSP.

Second Embodiment

Although the foregoing description of the digital FM demodulator 2 according to the first embodiment has been given with reference to the case where the amplitude A of the intermediate frequency signal $S_{(t)}$ takes a constant value Im, the digital FM demodulator 2 of this invention may be adapted to the case where the amplitude of the input signal $S_{(t)}$ is not constant. The following will discuss the structure and operation of the digital FM demodulator 2 according to the second embodiment, which is adapted to the case where it can demodulate the input FM signal even when the amplitude A of the intermediate frequency signal $S_{(t)}$ is not constant.

Figure 3:
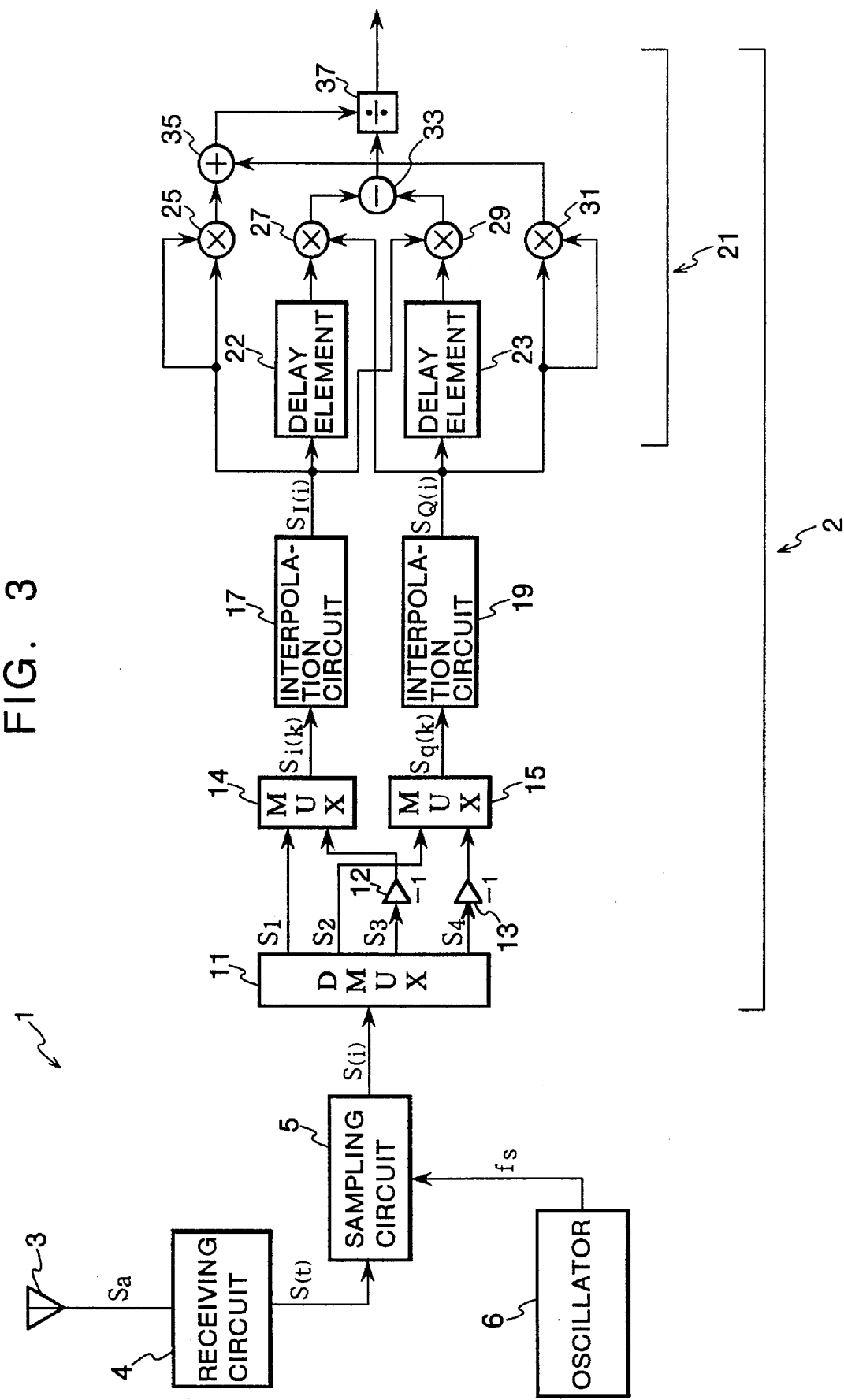
FIG. 3 is a block diagram showing the structure of an FM receiver according to the second embodiment of the present invention.

FIG. 3 shows the structure of the FM receiver 1 according to the second embodiment. The structure of this FM receiver 1 is basically the same as the one shown in FIG. 1, except for the structure of the arithmetic operation circuit 21.

The arithmetic operation circuit 21 in this embodiment comprises delay elements 22 and 23, multipliers 25, 27, 29 and 31, a subtracter 33, an adder 35, and a divider 37.

The multipliers 25 and 31 each obtain the square of the same signal. The adder 35 adds the output signals of the multipliers 25 and 31. The divider 37 divides the output signal of the subtracter 33 by the output signal of the adder 35. The delay elements 22 and 23, the multipliers 27 and 29 and the subtracter 33 have the same functions as those of the first embodiment.

An analog FM signal $S_{(t)}$ including amplitude information is expressed by an equation (34).

$$S_{(t)} = A_{(t)} \cdot \sin(2 \cdot \pi \cdot fc \cdot t + \delta \cdot \sin(2 \cdot \pi \cdot f \cdot t)) \quad (34)$$

The sampling circuit 5 samples the analog FM signal $S_{(t)}$ in accordance with the sampling signal and performs A/D conversion on the resultant signal to obtain a digital FM signal $S_{(i)}$ expressed by an equation (35).

$$S_{(i)} = A_{(i)} \cdot \sin((\pi \cdot i)/2 + \delta \cdot \sin(2 \cdot \pi \cdot f \cdot i/fs)) \quad (35)$$

The DMUX 11 sequentially outputs the individual signal components of the digital FM signal $S_{(i)}$ to the four output terminals to produce signals $S1_{(k)}$ to $S4_{(k)}$ expressed by the following equations (36) to (39). The carrier frequency fc and the sampling frequency fs have the relationship of fc=fs/4.

$$S1_{(k)}=A_{(4\cdot k-3)}\cdot\cos(\delta\cdot\sin(2\cdot\pi\cdot f\cdot(4\cdot k-3)/fs)) \quad (36)$$

$$S2_{(k)}=-A_{(4\cdot k-2)}\cdot\sin(\delta\cdot\sin(2\cdot\pi\cdot f\cdot(4\cdot k-2)/fs)) \quad (37)$$

$$S3_{(k)}=A_{(4\cdot k-1)}\cdot\cos(\delta\cdot\sin(2\cdot\pi\cdot f\cdot(4\cdot k-1)/fs)) \quad (38)$$

$$S4_{(k)}=A_{(4\cdot k)}\cdot\sin(\delta\cdot\sin(8\cdot\pi\cdot f\cdot k/fs)) \quad (39)$$

where k=1, 2, 3, . . .

The inverter 12 performs phase conversion of 180 degrees (sign inversion) on the signal $S3_{(k)}$ to obtain $-S3_{(k)}$, which is in turn supplied to the MUX 14. The MUX 14 receives the signal $S1_{(k)}$ and $-S3_{(k)}$ and alternately outputs the input signals, obtaining a signal $Si_{(k)}$ expressed by an equation (40).

The inverter 13 performs phase conversion of 180 degrees (sign inversion) on the signal $S4_{(k)}$ to obtain $-S4_{(k)}$, which is in turn supplied to the MUX 15. The MUX 15 receives the signal $S2_{(k)}$ and $-S4_{(k)}$ and alternately outputs the input signals, obtaining a signal $Sq_{(k)}$ expressed by an equation (41).

$$Si_{(k)}=A_{(2\cdot k-1)}\cdot\cos(\delta\cdot\sin(2\cdot\pi\cdot f\cdot(2\cdot k-1)/fs)) \quad (40)$$

$$Sq_{(k)}=A_{(2\cdot k)}\cdot\sin(\delta\cdot\sin(4\cdot\pi\cdot f\cdot k/fs)) \quad (41)$$

The zero inserting circuit 41 of the interpolation circuit 17 receives the signal $Si_{(k)}$, inserts data of a value of zero (0) between individual signal components, and outputs a signal $Si'_{(i)}$ given by an equation (42).

The zero inserting circuit 41 of the interpolation circuit 19 receives the signal $Sq_{(k)}$, inserts data of a value of zero (0) between individual signal components, and outputs a signal $Sq'_{(i)}$ given by an equation (43).

$$\begin{aligned}Si'_{(i)} &= \{S_{(1)}, 0, -S_{(3)}, 0, S_{(5)}, 0, -S_{(7)}, \ldots\} \quad (42)\\ &= \{A_{(1)}\cdot\cos(\delta\cdot\sin(2\cdot\pi\cdot f/fs)), 0,\\ &\quad A_{(3)}\cdot\cos(\delta\cdot\sin(6\cdot\pi\cdot f/fs)), 0, \ldots,\}\end{aligned}$$

$$\begin{aligned}Sq'_{(i)} &= \{0, S_{(2)}, 0, -S_{(4)}, 0, S_{(6)}, 0, -S_{(8)}, \ldots\} \quad (43)\\ &= \{0, A_{(2)}\cdot\sin(\delta\cdot\sin(4\cdot\pi\cdot f/fs)), 0,\\ &\quad A_{(4)}\cdot\sin(\delta\cdot\sin(8\cdot\pi\cdot f/fs)), \ldots,\}\end{aligned}$$

The LPF 42 of the interpolation circuit 17 removes the high-frequency component of the signal $Si'_{(i)}$ and outputs a digital signal $SI_{(i)}$ given by an equation (44). The LPF 42 of the interpolation circuit 19 removes the high-frequency component of the signal $Sq'_{(i)}$ and outputs a digital signal $SQ_{(i)}$ given by an equation (45).

$$SI_{(i)}=A_{(i)}\cdot\cos(\delta\cdot\sin(2\cdot\pi\cdot f\cdot i/fs)) \quad (44)$$

$$SQ_{(i)}=A_{(i)}\cdot\sin(\delta\cdot\sin(2\cdot\pi\cdot f\cdot i/fs)) \quad (45)$$

The signals $SI_{(i)}$ and $SQ_{(i)}$ are orthogonal to each other as indicated by an equation (46).

$$SI_{(i)}=\,^\sim SQ_{(i)} \quad (46)$$

Next, the multiplier 25 squares the signal $SI_{(i)}$ to obtain a signal $SI^2_{(i)}$. The multiplier 31 squares the signal $SQ_{(i)}$ to obtain a signal $SQ^2_{(i)}$. The adder 35 adds the signal $SI^2_{(i)}$ and the signal $SQ^2_{(i)}$ to obtain a signal $A^2_{(2)}$ expressed by an equation (47).

$$A^2_{(i)}=SI^2_{(i)}+SQ^2_{(i)} \quad (47)$$

The delay element 22 delays the signal $SI_{(i)}$ by one sampling period and outputs a signal $SI_{(i-1)}$. The multiplier 27 multiplies the signal $SI_{(i-1)}$ by the output signal $SQ_{(i)}$ of the interpolation circuit 19. The delay element 23 delays the signal $SQ_{(i)}$ by one sampling period and outputs a signal $SQ_{(i-1)}$. The multiplier 29 multiplies the signal $SQ_{(i-1)}$ by the output signal $SI_{(i)}$ of the interpolation circuit 17. The subtracter 33 subtracts the output signal of the multiplier 27 from the output signal of the multiplier 29, and outputs a digital signal $Y_{(i)}$ expressed by an equation (48).

$$\begin{aligned}Y_{(i)} &= SQ_{(i)}\cdot SI_{(i-1)}-SQ_{(i-1)}\cdot SI_{(i)} \quad (48)\\ &= A_{(i)}\cdot A_{(i-1)}\cdot\sin(\delta\cdot\sin(2\cdot\pi\cdot f\cdot i/fs)-\\ &\quad \sin(2\cdot\pi\cdot f\cdot(i-1)/fs))\end{aligned}$$

The divider 37 divides the digital signal $Y_{(i)}$ given by the equation (48) by the signal $A2_{(i)}$ given by the equation (47) and outputs a signal $Y_{(i)}/A^2_{(i)}$.

$$Y_{(i)}/A^2_{(i)}=A_{(i-1)}\cdot\sin(\delta\cdot(\sin(2\cdot\pi\cdot f\cdot i/fs)-\sin(2\cdot\pi\cdot f\cdot(i-1)/fs))/A(i) \quad (49)$$

Because the sampling frequency fs is sufficiently higher than the frequency f of the demodulated signal, an equation (50) is satisfied. Substituting the equation (50) into the equation (49) obtains an equation (51).

$$A_{(i-1)}/A_{(i)}\approx 1 \quad (50)$$

$$Y_{(i)}/A^2_{(i)}\approx\sin(\delta\cdot(\sin(2\cdot\pi\cdot f\cdot i/fs)-\sin(2\cdot\pi\cdot f\cdot(i-1)/fs))) \quad (51)$$

Because the sampling frequency fs is sufficiently higher than the frequency f of the demodulated signal, the equation (51) can be rewritten as an equation (52).

$$Y_{(i)}/A^2_{(i)}\approx\delta\cdot(\sin(2\cdot\pi\cdot f\cdot i/fs)-\sin(2\cdot\pi\cdot f\cdot(i-1)/fs)) \quad (52)$$

The demodulated signal may be obtained by integrating the signal $Y_{(i)}/A^2_{(i)}$ given by the equation (51) or the equation (52).

In the equations (51) and (52), the amplitude $A_{(i)}$ is canceled. That is, the demodulated signal can be obtained even if the amplitude information may be canceled. Even if an FM signal containing amplitude information is input, therefore, the digital FM demodulator 2 according to the second embodiment can still obtain the demodulated signal properly.

Although the foregoing description has been given on the assumption that fc=fs/4 is satisfied, the demodulation is still possible even when the carrier frequency fc is shifted from fs/4 as indicated by an equation (53).

$$fc=fs/4\pm\Delta f\quad 0<\Delta f<fs/4 \quad (53)$$

In this case, the equation (52) can be rewritten as an equation (54).

$$\begin{aligned}Y_{(i)}/A^2_{(i)} &\approx \sin(\delta\cdot(\sin(2\cdot\pi\cdot f\cdot i/fs)- \quad (54)\\ &\quad \sin(2\cdot\pi\cdot f\cdot(i-1)/fs))\pm s\cdot\pi\cdot\Delta f/fs)=\sin(\delta\cdot(\sin(2\cdot\pi\cdot f\cdot i/fs)-\\ &\quad \sin(2\cdot\pi\cdot f\cdot(i-1)/fs))\cos(2\cdot\pi\cdot\Delta f/fs)\pm\cos(\delta\cdot(\sin(2\cdot\pi\cdot f\cdot i/fs)-\\ &\quad \sin(2\cdot\pi\cdot f\cdot(i-1)/fs))\sin(2\cdot\pi\cdot\Delta f/fs)\end{aligned}$$

Because the sampling frequency fs is set sufficiently higher than the frequency f of the demodulated signal, the equation (54) can be rewritten as an equation (55).

$$Y_{(i)}/A^2_{(i)}\approx\delta\cos(2\cdot\pi\cdot\Delta f/fs)(\sin(2\cdot\pi\cdot f\cdot i/fs))-\sin(2\cdot\pi f\cdot(i-1)/fs)\pm\delta\cdot\sin(2\cdot\pi\cdot\Delta f/fs) \quad (55)$$

As is apparent from the equation (55), the DC (Direct Current) bias increases and the amplitude of the demodulated signal decreases as $\Delta f$ increases, but the tuning characteristic is substantially the same as that of an ordinary analog FM demodulator.

The digital FM demodulator 2 of this embodiment has only one LPF provided in each of the interpolation circuits 17 and 19. Therefore, the number of required LPFs can be minimized so that a digital FM demodulator with a simple and small-scale circuit structure can be provided. The digital FM demodulator 2 can easily be constituted of an integrated circuit such as IC or DSP.

Third Embodiment

While the first and second embodiments in the foregoing description have been described as demodulators which demodulate digital FM signals, this invention may also adapted to a demodulator which demodulates digital AM signals.

This type of digital demodulator will now be discussed specifically.

FIG. 4 exemplifies the structure of an AM demodulator. This structure is equivalent to the structure shown in FIG. 3 from which the delay elements 22 and 23, the multipliers 27 and 29, the subtracter 33 and the divider 37 are removed.

The operation of the AM demodulator with this structure will now be described.

An analog AM signal $S_{(t)}$ output from the receiving circuit 4 is expressed by an equation (56).

$$S_{(t)} = A_{(t)} \cdot \cos(2\pi \cdot fc \cdot t + 2\pi \cdot \Delta f + \phi) + \cos(2\pi \cdot fc \cdot t + 2\pi \cdot \Delta f + \phi) \quad (56)$$

where $A_{(t)}$ is an amplitude signal, fc is a carrier frequency, $\Delta f$ is an unknown frequency deviation and $\phi$ is a phase deviation.

When fc=fs/4, the output signal of the sampling circuit 5 is expressed by the following equation (57).

$$\{S_{(i)}\} = \{-(A_{(1)}+1)\cdot\sin(2\pi\cdot\Delta f+\phi), -(A_{(2)}+1)\cdot\cos(4\pi\cdot\Delta f+\phi), (A_{(3)}+1)\cdot\sin(6\pi\cdot\Delta f+\phi), (A_{(4)}+1)\cdot\cos(8\pi\cdot\Delta f+\phi), \ldots\} \quad (57)$$

The DMUX 11 outputs the individual data of this digital signal from the four output terminals. The inverters 12 and 13 invert the supplied data.

The MUX 14 alternately selects and outputs the output data S1 and −S3 from the DMUX 11. The MUX 15 alternately selects and outputs the output data −S2 and S4 from the DMUX 11. The output of the MUX 14 is expressed by an equation (58) and the output of the MUX 15 is expressed by an equation (59).

$$Si_{(k)} = (A_{(2\cdot k-1)}+1)\cdot\sin(2\cdot(2\cdot k-1)\cdot\pi\cdot\Delta f+\phi) \quad (58)$$

$$Sq_{(k)} = (A_{(2\cdot k)}+1)\cdot\cos(4\cdot k\cdot\pi\cdot\Delta f+\phi) \quad (k=1, 2, 3, \ldots) \quad (59)$$

The zero inserting circuit 41 of the interpolation circuit 17 outputs a digital signal $Si'_{(k)}$ expressed by an equation (60).

The zero inserting circuit 41 of the interpolation circuit 19 outputs a digital signal $Sq'_{(k)}$ expressed by an equation (61).

$$\{Si'_{(k)}\} = \{(A_{(1)}+1)\cdot\sin(2\pi\cdot\Delta f+\phi)\ 0,\ (A(3)+1)\cdot\sin(6\pi\cdot\Delta f+\phi),\ 0,\ \ldots,\} \quad (60)$$

$$\{sq'_{(k)}\} = \{0,\ (A_{(2)}+1)\cdot\cos(4\pi\cdot\Delta f+\phi),\ 0,\ (A_{(4)}+1)\cdot\sin(8\pi\cdot\Delta f+\phi),\ 0,\ \ldots,\} \quad (61)$$

The LPF 42 of the interpolation circuit 17 removes the high-frequency component from the digital signal $Si'_{(k)}$ given by the equation (60) and outputs a digital signal $SI_{(t)}$ expressed by an equation (62).

The LPF 42 of the interpolation circuit 19 removes the high-frequency component from the digital signal $Sq'_{(k)}$ given by the equation (61) and outputs a digital signal $SQ_{(t)}$ expressed by an equation (63).

$$SI_{(t)} = (A_{(t)}+1)\cdot\sin(2\pi\cdot\Delta f+\phi) \quad (62)$$

$$SQ_{(t)} = (A_{(t)}+1)\cdot\cos(2\pi\cdot\Delta f+\phi) \quad (63)$$

The multiplier 25 obtains the square of the output signal $SI_{(t)}$ of the interpolation circuit 17. The multiplier 31 obtains the square of the output signal $SQ_{(t)}$ of the interpolation circuit 19.

The adder 35 adds the digital signals output from the multipliers 25 and 31, and outputs a digital demodulated signal expressed by an equation (64).

$$y_{(t)} = I^2_{(t)} + SQ^2_{(t)} = (A_{(t)}+1)^2 \quad (64)$$

An analog demodulated signal is obtained by D/A conversion of this demodulated signal $y_{(t)}$.

Fourth Embodiment

FIG. 5 exemplifies the system structure in which the receiver 2 according to any of the first to third embodiments is accomplished by using a DSP (Digital Signal Processor).

The output signal of the receiving circuit 4 is supplied to an A/D converter 51 for A/D conversion, which serves as the sampling circuit 5. The output signal of the A/D converter 51 is supplied to a DSP 52 which constitutes the digital demodulator 2. The digital demodulated signal output from the DSP 52 is converted to an analog signal by a D/A converter 53. An audio signal output from the D/A converter 53 is supplied to an analog LPF 54 where its high-frequency component is removed. The resultant signal is supplied via a driving amplifier or the like to a loudspeaker or the like. The A/D converter 51 is also supplied with a sampling clock of a frequency fs from an oscillator 55. The sampling clock signal is supplied as an operation clock to the DSP 52 and the D/A converter 53.

The sampling frequency fs is very high as compared with the frequency of the demodulated signal. For an analog demodulator, the sampling frequency fs is determined by an equation (65) if the maximum frequency deviation fd of an analog FM signal is set to 5 Hz, the same as that of an ordinary FM receiver.

$$fs/4 + 15\ KHz \leq f/2 \quad (65)$$

Thus, the sampling frequency fs is set to fs≧60 Hz. The digital FM demodulator 2 of this invention was evaluated by using the structure shown in FIG. 5.

First, the specification of the evaluating system will be discussed.

16-bit TMS320C25 of a fixed point type was used as the DSP 52, and the sampling frequency fs was set to 62.5 Hz. The LPFs 42 used in the interpolation circuits 17 and 19 were constituted one-order low-pass filters having a cutoff frequency of 18 Hz, the maximum frequency deviation fd of an analog FM signal was set to 5 Hz, and a tone signal of 1 Hz was used as the demodulated signal.

Figure 7:
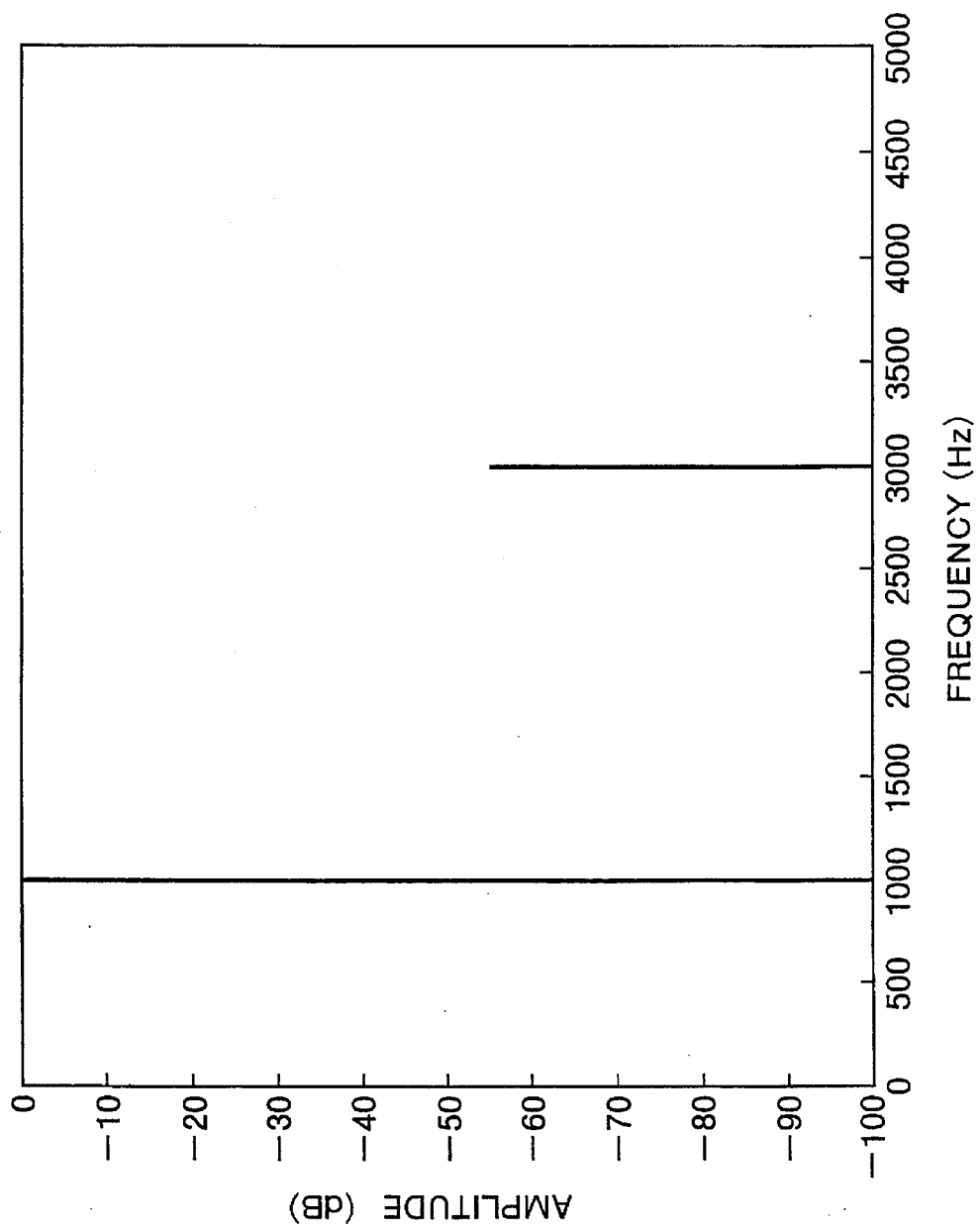
FIG. 7 is a spectrum distribution diagram for an FM demodulated signal used in evaluating the digital demodulator having the structure shown in FIG. 5.
Figure 8:
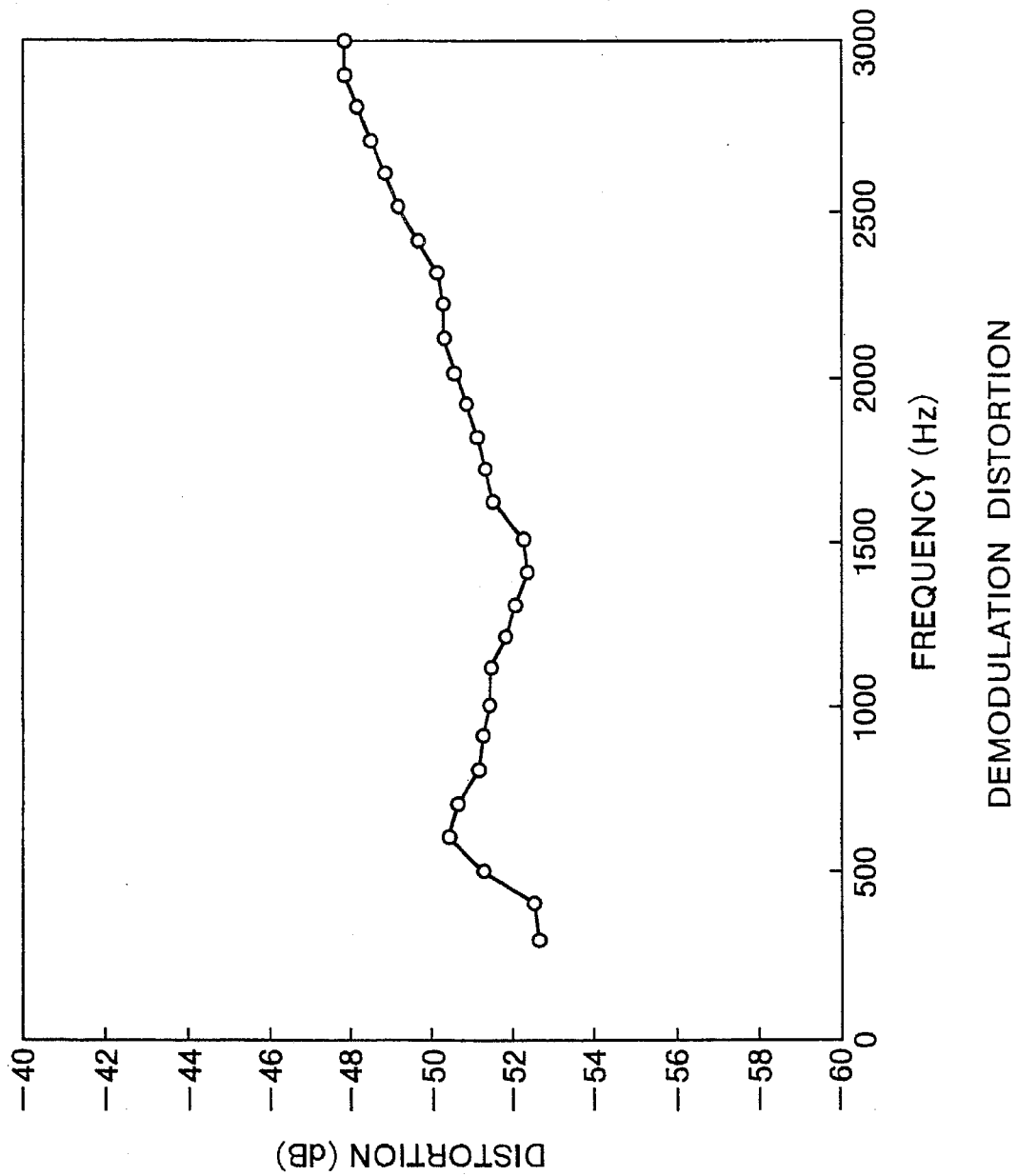
FIG. 8 is a graph showing the relationship between the frequency of a demodulated signal and demodulation distortion.

FIGS. 6 and 7 show the spectrum distributions of an FM modulated signal and an FM demodulated signal in this case, respectively. FIG. 8 shows the demodulation distortion at 300 Hz to 3 Hz. It was confirmed that the demodulation distortion is extremely small such that the maximum demodulation distortion for the signal level of 0 dB was −47 dB or smaller.

It is apparent from this evaluation result that the FM demodulator 2 according to the above-described embodiments, though having a relatively simple structure, can obtain high-quality demodulated signals.

This invention is not limited to the above-described embodiments, but may be modified and adapted in various other forms.

For instance, although the signals $S3_{(k)}$ and $S4_{(k)}$ in the output signal of the DMUX 11 are respectively input to the inverters 12 and 13 to accomplish phase conversion of 180 degrees (sign inversion) in the structures in FIGS. 1 and 3, the signals $S2_{(k)}$ and $S3_{(k)}$ may be input to those inverters, i.e., one of the signals $S1_{(k)}$ and $S3_{(k)}$ and one of the signals $S2_{(k)}$ and $S4_{(k)}$ may be input to the inverters for phase conversion.

Although the signals $S2_{(k)}$ and $S3_{(k)}$ in the output signal of the DMUX 11 are respectively input to the inverters 12 and 13 to accomplish phase conversion of 180 degrees (sign inversion) in the structure in FIG. 4, the signals $S3_{(k)}$ and $S4_{(k)}$ may be input to those inverters, i.e., one of the signals $S1_{(k)}$ and $S3_{(k)}$ and one of the signals $S2_{(k)}$ and $S4_{(k)}$ may be input to the inverters for phase conversion.

Figure 9:
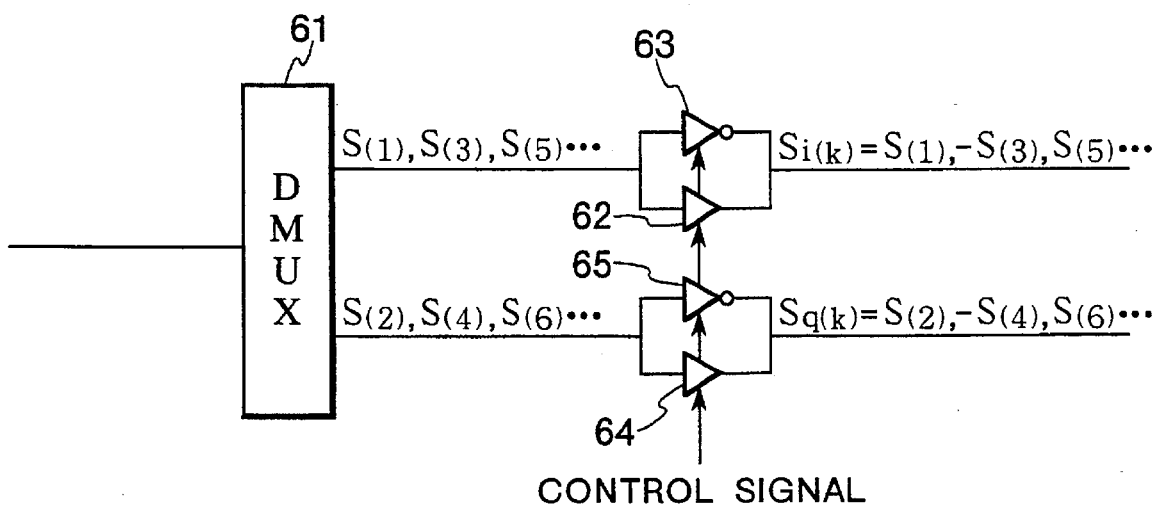
FIG. 9 is a block diagram showing a modification of a circuit for producing a time sequential signal.

Although the demultiplexer and multiplexer are used to produce the signals $Si_{(k)}$ and $Sq_{(k)}$ in the above-described embodiments, any structure may be employed as long as time sequential signals whose absolute values are expressed by $Si_{(k)}$ and $Sq_{(k)}$ are obtained. For example, the structure in FIG. 9 has a two-output demultiplexer 61 which sequentially outputs signals $S_{(1)}$, $S_{(3)}$, $S_{(5)}$, and so forth from one of the output terminals, and sequentially outputs signals $S_{(2)}$, $S_{(4)}$, $S_{(6)}$ and so forth from the other output terminal. Time sequential signals $Si_{(k)}$ and $Sq_{(k)}$ can be produced by directly outputting the signals $Si_{(1)}$, $S_{(5)}$ and so forth and the signals $S_{(2)}$, $S_{(6)}$ and so forth via buffers 62 and 64, and outputting the signals $S_{(3)}$, $S_{(7)}$ and so forth and the signals $S_{(4)}$, $S_{(8)}$ and so forth after being inverted by respective inverters 63 and 65.

In short, this invention can provide a high-performance digital demodulator with a small-scale and simple circuit structure without using a complex circuit like a 90 degree phase shifter or the like which has a large amount of hardware.

What is claimed is:

1. A digital demodulator comprising:

time sequential signal generating means for receiving a digital signal and producing a first signal, which includes of a sequence of odd-numbered data in said received digital signal and whose sign is inverted data by data, and a second signal, which includes a sequence of even-numbered data in said received digital signal and whose sign is inverted data by data;

first interpolation means for inserting data having a value of zero between individual pieces of data of said first signal output from said time sequential signal generating means;

second interpolation means for inserting data having a value of zero between individual pieces of data of said second signal output from said time sequential signal generating means; and arithmetic operation means for producing a digital demodulated signal from output signals of said first interpolation means and said second interpolation means.

2. The digital demodulator according to claim 1, wherein said time sequential signal generating means includes:

demultiplexer means for receiving a digital reception signal and outputting data in said digital reception signal in circulation to thereby convert said digital reception signal to first to fourth time sequential signals;

phase conversion means for shifting a phase of one of said first and third time sequential signals and a phase of one of said second and fourth time sequential signals by 180 degrees;

first multiplexer means for receiving the other one of said first and third sequential signals and said phase-shifted one of said first and third sequential signals from said phase converting means and alternately and sequentially outputting said received signals; and second multiplexer means for receiving the other one of said second and fourth sequential signals and said phase-shifted one of said second and fourth sequential signals from said phase converting means and alternately and sequentially outputting said received signals.

3. The digital demodulator according to claim 1, wherein said arithmetic operation means includes:

first delay means for delaying an output signal of said first interpolation means by one sampling period of said digital reception signal;

second delay means for delaying an output signal of said second interpolation means by one sampling period of said digital reception signal;

first multiplier means for multiplying an output signal of said first delay means by an output signal of said second interpolation means;

second multiplier means for multiplying an output signal of said first interpolation means by an output signal of said second delay means; and subtraction means for obtaining a difference between an output signal of said second multiplier means and an output signal of said first multiplier means.

4. The digital demodulator according to claim 1, wherein said arithmetic operation means includes:

first delay means for delaying an output signal of said first interpolation means by one sampling period of said digital reception signal;

second delay means for delaying an output signal of said second interpolation means by one sampling period of said digital reception signal;

first multiplier means for multiplying an output signal of said first delay means by an output signal of said second interpolation means;

second multiplier means for multiplying an output signal of said first interpolation means by an output signal of said second delay means;

subtraction means for obtaining a difference between an output signal of said second multiplier means and an output signal of said first multiplier means;

third multiplier means for obtaining a square of said output signal of said first interpolation means;

fourth multiplier means for obtaining a square of said output signal of said second interpolation means;

adder means for adding an output signal of said third multiplier means and an output signal of said fourth multiplier means; and divider means for dividing one of an output signal of said subtraction means and an output signal of said adder means by the other.

5. The digital demodulator according to claim 1, wherein said arithmetic operation means includes:

first square means for obtaining a square of said output signal of said first interpolation means;

second square means for obtaining a square of said output signal of said second interpolation means; and adder means for adding an output signal of said first square means and an output signal of said second square means.

6. The digital demodulator according to claim 1, wherein each of said first and second interpolation means includes inserting means for inserting a signal having a value of zero between individual data of said first signal and a low-pass filter for removing a high-frequency component of an output signal of said inserting means.

7. A digital demodulator comprising:

first means for producing digital signals $Si_{(k)}$ and $Sq_{(k)}$ respectively expressed by equations (67) and (68) from a digital signal $S_{(i)}$ expressed by an equation (66);

second means for producing digital signals $Si'_{(i)}$ and $Sq'_{(i)}$ respectively expressed by equations (69) and (70) from said digital signals $Si_{(k)}$ and $Sq_{(k)}$;

third means for producing digital signals $SI_{(i)}$ and $SQ_{(i)}$ respectively expressed by equations (71) and (72) from said digital signals $Si'_{(i)}$ and $Sq'_{(i)}$; and fourth means for producing a digital demodulated signal $y_{(i)}$ expressed by an equation (73) from said digital signals $SI_{(i)}$ and $SQ_{(i)}$;

$$S_{(i)} = A \cdot \sin(2\cdot\pi\cdot fc\cdot i/fs + \delta\cdot\sin(2\cdot\pi\cdot f\cdot i/fs)) \quad (66)$$

where A is an amplitude, $\delta = fd/f$, fd is a maximum frequency deviation, f is a frequency of a modulated signal, fs is a sampling frequency, i=1, 2, 3, . . . , and fc is a carrier frequency and fc=fs/4, $$Si_{(k)} = A_{(2\cdot k-1)} \cdot \cos(\delta\cdot\sin(2\cdot\pi\cdot f\cdot(2\cdot k-1)/fs)) \ (k=1, 2, 3, \ldots) \quad (67)$$

$$Sq_{(k)} = A_{(2\cdot k)} \cdot \sin(\delta\cdot\sin(4\cdot\pi\cdot f\cdot k/fs)) \quad (68)$$

$$Si'_{(i)} = \{A_{(1)} \cdot \cos(\delta\cdot\sin(2\cdot\pi\cdot f/fs)), 0, A_{(3)} \cdot \cos(\delta\cdot\sin(6\cdot\pi\cdot f/fs)), 0, \ldots ,\} \quad (69)$$

$$Sq'_{(i)} = \{0, A_{(2)} \cdot \sin(\delta\cdot\sin(4\cdot\pi\cdot f/fs)), 0, A_{(4)} \cdot \sin(\delta\cdot\sin(8\cdot\pi\cdot f/fs)), \ldots ,\} \quad (70)$$

$$SI_{(i)} = A_{(i)} \cdot \cos(\delta\cdot\sin(2\cdot\pi\cdot f\cdot i/fs)) \quad (71)$$

$$SQ_{(i)} = A_{(i)} \cdot \sin(\delta\cdot\sin(2\cdot\pi\cdot f\cdot i/fs)) \quad (72)$$

$$y_{(i)} = B \cdot \{\sin(2\cdot\pi\cdot f\cdot i/fs) - \sin(2\cdot\pi\cdot f\cdot(i-1)/fs)\} \quad (73)$$

where B is approximately constant.

8. The digital demodulator according to claim 7, wherein said first means includes:

first conversion means for producing four digital signals $S1_{(k)}$ to $S4_{(k)}$, expressed by equations (74) to (77), from a digital FM signal $S_{(i)}$ expressed by said equation (66), and second conversion means for producing said digital signals $Si_{(k)}$ and $Sq_{(k)}$, expressed by said equations (67) and (68), from said digital signals $S1_{(k)}$ to $S4_{(k)}$, $$S1_{(k)} = A \cdot \cos(\delta\cdot\sin(2\cdot\pi\cdot f\cdot(4\cdot k-3)/fs)) \quad (74)$$

$$S2_{(k)} = -A \cdot \sin(\delta\cdot\sin(2\cdot\pi\cdot f\cdot(4\cdot k-2)/fs)) \quad (75)$$

$$S3_{(k)} = -A \cdot \cos(\delta\cdot\sin(2\cdot\pi\cdot f\cdot(4\cdot k-1)/fs)) \quad (76)$$

$$S4_{(k)} = A \cdot \sin(\delta\cdot\sin(8\cdot\pi\cdot f\cdot k/fs)) \quad (77).$$

9. The digital demodulator according to claim 7, wherein said third means comprises a low-pass filter for removing high-frequency components of said signals $Si'_{(i)}$ and $Sq'_{(i)}$.

10. The digital demodulator according to claim 7, wherein said amplitude A is constant; and said fourth means includes:

first delay means for delaying said signal $SI_{(1)}$ by a predetermined sampling period to produce a signal $SI_{(i-10)}$;

second delay means for delaying said signal $SQ_{(i)}$ by a predetermined sampling period to produce a signal $SQ_{i-1}$;

first multiplier means for multiplying said signal $SQ_{(i-1)}$ by said signal $SI_{(i)}$;

second multiplier means for multiplying said signal $SI_{(i-1)}$ by said signal $SQ_{(i)}$;

subtraction means for obtaining a difference between an output signal of said first multiplier means and an output signal of said second multiplier means.

11. The digital demodulator according to claim 7, wherein said fourth means includes:

first delay means for delaying said signal $SI_{(i)}$ by a predetermined sampling period to produce a signal $SI_{(i-1)}$;

second delay means for delaying said signal $SQ_{(i)}$ by a predetermined sampling period to produce a signal $SQ_{(i-1)}$;

first multiplier means for multiplying said signal $SQ_{(i-1)}$ by said signal $SI_{(i)}$;

second multiplier means for multiplying said signal $SI_{(i-1)}$ by said signal $SQ_{(i)}$;

third multiplier means for obtaining a square of said signal $SI_{(i-1)}$;

fourth multiplier means for obtaining a square of said signal $SQ_{(i)}$;

subtraction means for obtaining a difference between an output signal of said first multiplier means and an output signal of said second multiplier means;

adder means for adding an output signal of said third multiplier means and an output signal of said fourth multiplier means; and divider means for dividing one of an output signal of said subtraction means and an output signal of said adder means by the other.

12. A digital demodulator comprising:

first means for producing digital signals $Si_{(k)}$ and $Sq_{(k)}$ respectively expressed by equations (79) and (80) from a digital signal $S_{(i)}$ expressed by an equation (78);

second means for producing digital signals $Si'_{(k)}$ and $Sq'_{(k)}$ respectively expressed by equations (81) and (82) from said digital signals $Si_{(k)}$ and $Sq_{(k)}$;

third means for producing digital signals $SI_{(i)}$ and $SQ_{(i)}$ respectively expressed by equations (83) and (84) from said digital signals $Si'_{(k)}$ and $Sq'_{(k)}$; and fourth means for producing a digital demodulated signal $y_{(i)}$ expressed by an equation (85) from said digital signals $SI_{(i)}$ and $SQ_{(i)}$;

$$S_{(i)} = (A+1) \cdot \cos(2\cdot\pi\cdot fc\cdot i/fs) \quad (78)$$

where A is an amplitude signal, fc is a carrier frequency, and fs is a sampling frequency, $$Si_{(k)} = (A+1) \cdot \sin(2\cdot(2\cdot k-1)\cdot\pi\cdot\Delta f+\phi) \quad (79)$$

where k=1, 2, 3, . . . m $\Delta f$ is a frequency deviation, and $\phi$ is a phase deviation, $$Sq_{(k)} = (A+1) \cdot \cos(4\cdot k\cdot\pi\cdot\Delta f+\phi) \quad (80)$$

$$\{Si'_{(k)}\} = \{(A+1) \cdot \sin(2\cdot\pi\cdot\Delta f+\phi), 0, (A+1)\cdot\sin(6\cdot\pi\cdot\Delta f+\phi), 0, \ldots ,\} \quad (81)$$

$$\{Sq'_{(k)}\} = \{0, (A+1) \cdot \cos(4\cdot\pi\cdot\Delta f+\phi), 0, (A+1)\cdot\sin(8\cdot\pi\cdot\Delta f+\phi), 0, \ldots ,\} \quad (82)$$

$$SI_{(i)} = (A+1) \cdot \sin(2\cdot\pi\cdot\Delta f+\phi) \quad (83)$$

$$SQ_{(i)} = (A+1) \cdot \cos(2\cdot\pi\cdot\Delta f+\phi) \quad (84)$$

$$y_{(i)} = (A+1)^2 \quad (85).$$

* * * * *